United States Patent [19]

Maschek et al.

[11] Patent Number: 4,794,487
[45] Date of Patent: Dec. 27, 1988

[54] HEAT PROTECTION CASING

[75] Inventors: Martin Maschek, Würenlos; Georg Mastner, Niederrohrdorf, both of Switzerland

[73] Assignee: BBC Brown Boveri AG, Baden, Switzerland

[21] Appl. No.: 100,847

[22] Filed: Sep. 25, 1987

[30] Foreign Application Priority Data

Sep. 29, 1986 [CH] Switzerland .................. 3897/86

[51] Int. Cl.⁴ .............................................. H05K 7/20
[52] U.S. Cl. ................................ 361/383; 174/16.1;
336/59; 336/61; 361/212; 361/424
[58] Field of Search .................... 336/54, 61; 361/331,
361/334, 380, 220, 212, 381–384, 386, 417, 383,
419, 424; 165/80; 357/81; 174/15 R, 16 R;
312/223; 206/328, 334

[56] References Cited

U.S. PATENT DOCUMENTS

| | | | |
|---|---|---|---|
| 2,471,011 | 5/1949 | Shapiro | 361/383 |
| 3,414,727 | 12/1968 | Bonilla | 174/15 R |
| 4,146,112 | 3/1979 | Usry | 336/59 |
| 4,370,700 | 1/1983 | Duddles | 361/424 |
| 4,500,944 | 2/1985 | Roberts | 174/16 R |
| 4,553,190 | 11/1985 | Moeller | 361/212 |

FOREIGN PATENT DOCUMENTS 6930521 12/1969 Fed. Rep. of Germany .
7038595 1/1971 Fed. Rep. of Germany .
2094947 9/1982 United Kingdom .

OTHER PUBLICATIONS

"Erwarmungserscheinungen im Feingeratebau und ihre Gegenmabnahmen", Feingeratetechnik, vol. 9, 4 (1960), pp. 148–153.

Primary Examiner—G. P. Tolin
Attorney, Agent, or Firm—Burns, Doane, Swecker & Mathis

[57] ABSTRACT

To improve the heat protection of an electronic device (7) in the case of heat radiation coming from the outside, for example solar rays, lateral radiation reflectors (12, 13; 16, 17) of 1 mm-thick aluminium plate polished on both sides and degreased are arranged between the electronic device and the walk (20, 21) of a heat protection casing (1) which laterally surrounds the electronic device. In addition, upper radiation reflectors (14, 15) are provided between the coverplate of the electronic device (7) and a coverplate (4) of the heat protection casing (1), a ventilation opening (18) remaining to the lateral radiation reflectors. In the sidewall of the heat protection casing (1), lower and upper ventilation slots (5,6) are arranged by means of which a chimney effect is achieved in the interior of the heat protection casing. In addition, a bottom plate (2) of the heat protection casing (1) can exhibit cooling openings (3).

7 Claims, 1 Drawing Sheet

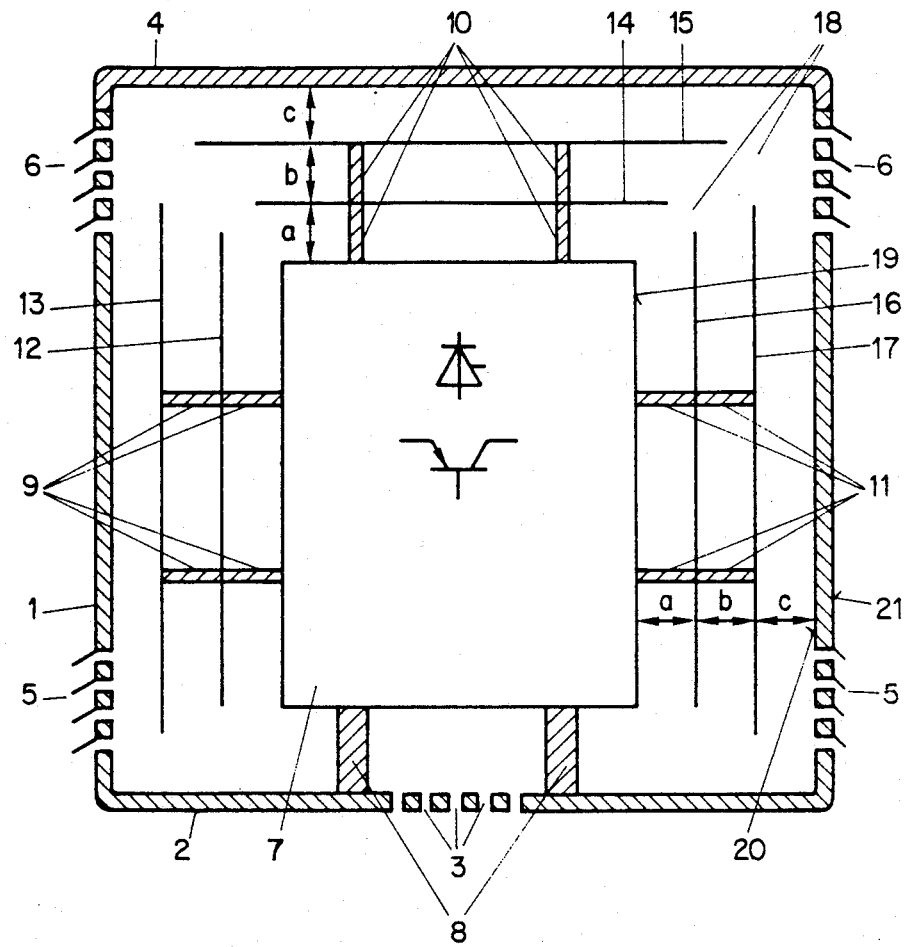

HEAT PROTECTION CASING

FIELD OF THE INVENTION

The invention is based on a heat protection casing for at least one electronic device.

BACKGROUND OF THE INVENTION

The invention generally relates to a known type of heat protection casing such as that known from the German journal: Feingeratetechnik Vol. 9, 4 (1960), pages 148–153. A chimney effect and thus good heat removal due to convection is achieved by means of holes close to the cover and base plate of the heat protection casing and by means of an intermediate flow duct which is as long as possible. Vertical chassis arrangements and large cooling surfaces bring further improvements in the cooling effect. It was possible to reduce the temperatures in the interior of the heat protection casing by half by means of surfaces having good radiation characteristics. According to this printed document, metallic surfaces which are bare on one side or even both sides must be rejected if they are to remove heat.

OBJECTS AND SUMMARY OF THE INVENTION

The invention achieves the object of specifying a heat protection casing for at least one electronic device, which exhibits improved heat protection in the case of heat radiation coming from the outside.

One advantage of the invention lies in the fact that the operating temperature for semiconductor components of the protected electronic device can be kept lower and the failure rate of the electronic components drops. This is of significance particularly in the case where the electronics are exposed to solar irradiation or other intensive heat radiation. Electronics installed in the open must in most cases be protected against environmental influences (weather, birds, mice, wasps and so forth) which necessitates an encapsulation which is mechanically good and thus thermally poor. The heat protection casing according to the invention makes it possible to achieve that, in practice, the irradiated outside wall does not pass the absorbed heat onto the protected electronics. In a development of the invention, a temperature increase in the interior of the heat protection casing due to solar irradiation was only about 1K.

BRIEF DESCRIPTION OF THE DRAWING

In the text which follows, the invention is explained with the aid of an illustrative embodiment. The only FIGURE shows a section of a heat protection casing with an electronic device, shown diagrammatically.

DETAILED DESCRIPTION OF A PREFERRED EMBODIMENT

A cube-shaped outer casing or heat protection casing 1 of 2 mm-thick stainless steel exhibits a bottom or a bottom plate 2 having ventilation slots 3 in its central area and a cover or a coverplate 4 which can be removed upward. To ensure good ventilation of the internal space of the heat protection casing 1, the coverplate 4 does not need to be attached hermetically sealed.

Closely above the bottom plate 2, lower ventilation slots 5 are provided at least in opposite sidewalls of the heat protection casing 1 and upper ventilation slots 6 are provided immediately below the coverplate 4. To achieve a chimney effect in the interior of the heat protection casing 1, no holes or ventilation slots are provided in as long an area as possible between the lower and upper ventilation slots 5 and 6. The ventilation slots 5 and 6 are protected against direct solar irradiation and rain penetration by inclined areas projecting at the outside of the heat protection casing 1.

In the interior of the heat protection casing 1, an encapsulated cube-shaped electronic device 7, preferably an electronic signal processing device for the measurement signal of a current transformer, which is to be protected against solar or heat irradiation from the outside, is attached to the bottom plate 2 by means of screws or supports 8. The supports 8 can be insulators or metal bolts having a small cross-section in order to keep heat conduction as low as possible.

At the four side walls of the electronic device 7, inner radiation reflectors 12 and 16 are provided at a distance a of 3 cm and further outer radiation reflectors 13 and 17 at a distance b of 3 cm from these inner radiation reflectors. The outer radiation reflectors 13 and 17 have a distance c of 3 cm from a lateral inside surface 20 of the heat protection casing 1. The lateral radiation reflectors 12, 13, 16 and 17 are at least as high as the electronic device 7, preferably at least the outer radiation reflectors 13 and 17 project past the electronic device 7 at the bottom and at the top so that they completely shield it at the side from the heat protection casing 1.

At preferably identical distances a, b, c, upper radiation reflectors 14 and 15 are provided above the electronic device 7 which are laterally spaced apart from the lateral radiation reflectors 12, 13, 16 and 17 so that ventilation openings 18 remain between them and the lateral radiation reflectors.

The radiation reflectors 12–17 are each attached with four screws or supports 9–11 to sidewalls which are good reflectors for heat rays or to a coverplate of the electronic device 7 which is a good reflector. The supports 9–11 are intended to be poor conductors for heat. All radiation reflectors 12–17 consist of 1 mm-thick aluminium plate having a surface which is degreased and polished on both sides, having a reflection coefficient of $\geq 0.8$. The coverplate and lateral surfaces 19 of the electronic device 7 and the lateral inside surface 20 and the inside surface of the coverplate 4 of the heat protection casing 1 are also constructed to be good reflectors with respect to heat rays, having a reflection coefficient of $\geq 0.5$. The four lateral outside surfaces 21 and the outside surface of the coverplate 4 of the heat protection casing 1 are painted and thus weather resistant.

The radiation reflectors 12–17 have the effect that the heat radiated towards the inside from the lateral inside surface 20 and the inside surface of the coverplate 4 of the heat protection casing 1 is reflected so that the outside wall can only give off the total heat to the outside by radiation and by convection. The heated-up lateral outside wall of the heat protection casing 1 also forces an upward airflow in the interior of the heat protection casing so that the environmental air not heated by radiation is sucked in through the lower ventilation slots 5 which, in turn, removes radiation heat from the outside and the heat produced by operation of the elctronics through the upper ventilation slots 6. The cooling effect for the electronic device 7 is supported by the cooling slots 3 in the bottom plate 2.

Good heat protection is already achieved with only one lateral radiation reflector 13, 17 each between the sidewalls of the heat protection casing 1 and the electronic device 7. The distance c should not be less than 5 mm.

The radiation reflectors can also be constructed to be strip-shaped and arranged with an offset from the inside towards the outside so that the electronic device 7 is at least laterally completely shielded by radiation reflectors.

Instead of the radiation reflectors 12-17 of aluminium plate, double windows having two glass panes which are silvered on the inside and are mutually spaced apart and sealed can be used. The important factor is that heat is radiated towards the outside.

The distances a-c can be selected to be greater than 0.5 cm.

Naturally, instead of a cube-shaped heat protection casing 1, for example a circular-cylindrical one can also be selected, in which case circular cylindrical or strip-shaped lateral radiation reflectors are used.

While this invention has been illustrated and described in accordance with a preferred embodiment, it is recognized that variations and changes may be made and equivalents employed herein without departing from the invention as set forth in the claims.

We claim:

1. A thermal protection housing for at least one electronic device, the thermal protection housing including a bottom plate, a cover plate opposite the bottom plate, and side plates, the plates enclosing the at least one electronic device, first lateral ventilation openings being provided adjacent the bottom plate and second lateral ventilation openings being provided adjacent the cover plate, the improvement comprising:

first and second upper radiating reflectors supported between the at least one electronic device and the cover plate, the first and second radiating reflectors being spaced from each other as well as from the cover plate and the at least one electronic device;

first and second side radiating reflectors supported between each side plate and the at least one electronic device, the first and second side radiating reflectors being spaced from each other as well as from the side plate, the at least one electronic device, and the first and second upper radiating reflectors to provide a ventilating opening between the side radiating reflectors and the upper radiating reflectors so that all of the reflectors may be ventilated on all sides thereof.

2. The thermal protection housing according to claim 1, wherein the at least one electronic device includes an outer lateral surface which is a heat reflector and the side plates include inside surfaces which are heat reflectors.

3. The thermal protection housing according to claim 1, wherein each upper radiating reflector includes a reflector surface facing the cover plate which has a reflection coefficient greater than 0.5, and each side radiating reflector includes a reflector surface facing the side plate from which it is spaced which has a reflection coefficient greater than 0.5.

4. The thermal protection housing according to claim 1, wherein each upper radiating reflector includes a reflector surface facing the cover plate which has a reflection coefficient greater than 0.8, and each side radiating reflector includes a reflector surface facing the side plate from which it is spaced which has a reflection coefficient greater than 0.8.

5. The thermal protection housing according to claim 1, wherein each radiating reflector includes reflector surfaces of polished aluminum.

6. The thermal protection housing according to claim 5, wherein the reflector surfaces are degreased.

7. The thermal protection housing according to claim 1, wherein the side plates include outer side plate surfaces which have reflection coefficients greater than 0.3.

* * * * *